United States Patent [19]

Utsunomiya

[11] 4,023,106
[45] May 10, 1977

[54] INPUT CIRCUIT OF VHF TELEVISION SET TUNER

[75] Inventor: Keisuke Utsunomiya, Kadoma, Japan

[73] Assignee: Matsushita Electric Industrial Co., Ltd., Japan

[22] Filed: Sept. 15, 1975

[21] Appl. No.: 613,504

[30] Foreign Application Priority Data

Sept. 17, 1974 Japan .................... 49-108057

[52] U.S. Cl. ............................ 325/462; 325/489; 334/15

[51] Int. Cl.² .................................. H04B 1/18

[58] Field of Search .......... 325/333, 335, 376, 377, 325/379-381, 383, 385, 388, 458, 459, 462, 463, 452, 427, 488-490; 334/15

[56] References Cited

UNITED STATES PATENTS

| | | | |
|---|---|---|---|
| 2,027,986 | 1/1936 | Kinross | 325/383 |
| 2,188,964 | 2/1940 | Sinninger | 325/385 |
| 2,259,596 | 10/1941 | Nreeland | 325/383 |
| 2,310,323 | 2/1943 | Sharp | 325/383 |
| 2,591,081 | 4/1952 | Lyman et al. | 325/385 |
| 3,162,809 | 12/1964 | Yax | 325/381 |
| 3,289,087 | 11/1966 | Birkenes | 325/383 |
| 3,450,994 | 6/1969 | Arntsen et al. | 325/385 |
| 3,559,075 | 1/1971 | Okazaki | 325/459 |
| 3,628,152 | 12/1971 | Carlson | 325/459 |
| 3,727,140 | 4/1973 | Nieto et al. | 325/458 |
| 3,794,924 | 2/1974 | Furuya et al. | 325/488 |
| 3,903,487 | 9/1975 | Maier | 325/458 |

Primary Examiner—Robert L. Griffin
Assistant Examiner—Marc E. Bookbinder
Attorney, Agent, or Firm—Robert E. Burns; Emmanuel J. Lobato; Bruce L. Adams

[57] ABSTRACT

In an input circuit of a VHF television tuner tunable to the frequencies of a desired channel by varying a d.c. potential applied to a plurality of varactors provided therein, an impedance matching within the input circuit is carried out by adjusting the ratio of inductance of inductive elements provided for selecting the desired channel, and also one of the inductive elements is connected to a capacitor forming a wave trap therewith.

2 Claims, 8 Drawing Figures

INPUT CIRCUIT OF VHF TELEVISION SET TUNER

The present invention relates generally to an input circuit of a VHF (very high frequency) television set tuner, and particularly to an input circuit of a VHF television set tuner of a type that may be tuned to the frequencies of selected television channels by varying a potential applied to a plurality of varactors or varicaps incorporated therein.

FIGS. 1–3b have been attached for perusal with the following description of prior art, and thereafter how the disadvantages thereof will be overcome by the present invention will be described.

A television tuner employing the varactors, which is schematically shown in a block diagram in FIG. 1, comprises an input circuit A, an interstage circuit B, a mixer stage D, a local oscillator C, and a variable d.c. power source E. As shown, four tuned circuits $a$, $b1$ and $b2$, and $c$, each of which has a varactor therein, are provided in the input circuit A, the interstage circuit B, and the local oscillator C, respectively. To the tuned circuits is connected the variable d.c. power source E the potential of which is varied upon changing a television channel to another to vary the capacitances of the varactors. Thus, the resonance frequencies of the tuned circuits are varied so that the tuner is tuned to picture and sound carriers of a desired channel.

In an input circuit design of a VHF television set tuner tunable to the frequencies of a desired channel by varying a d.c. potential applied from a variable d.c. power source to a plurality of varactors provided therein, considerable attention must be paid to a number of factors, two of these factors requiring especial consideration: that is, the first is elevation of selectivity of incoming signals and the second is a widening of the range of tuned frequency variation due to change of d.c. potential applied to the varactor.

However, an input circuit has not been hitherto proposed which provides high signal selectivity and sufficient wide range of tuned frequency variation. These drawbacks of the prior art will be discussed in detail in connection with FIG. 2.

It is an object of the present invention to provide an improved input circuit of a VHF television set tuner of a type which is tuned to a desired channel by varying a potential applied to varactors or varicaps provided therein, wherein impedance matching between a r-f amplifier and its preceding circuit is not performed by a capacitor but by changing the ratio of the inductance of inductive elements used for selecting the desired channel, thereby to elevate signal selectivity and to widen the tuned frequency range.

It is another object of the present invention to provide an improved input circuit of a VHF television set tuner of the above-mentioned type, wherein a capacitor is provided forming a series wave trap together with one of inductive elements used for selecting a desired channel, thereby to elevate signal selectivity and to widen the tunable frequency range.

The present invention concerns an input circuit for use in a television set tuner tunable to the frequencies of a desired channel by varying a d.c. potential applied from a variable d.c. power source to a plurality of varactors provided therein, the input circuit comprising a first stage and a second stage, the first stage being connected to a receiving antenna and comprising a tuning circuit which includes a varactor and a plurality of inductive elements for selecting the desired channel, and the second stage including a radio-frequency amplifier for amplifying signals of the desired channel, wherein an impedance matching between the first and second stages is carried out by adjusting the ratio of the inductance of the plurality of the inductive elements, and furthermore one of the plurality of the inductive elements is connected to a capacitor forming a wave trap therewith.

Additional objects as well as features and advantages of the invention will become evident from the detailed description set forth hereinafter when considered in conjunction with the accompanying drawings, wherein like parts in each of the several figures are identified by the same reference numerals and characters, and wherein.

Figure 1:
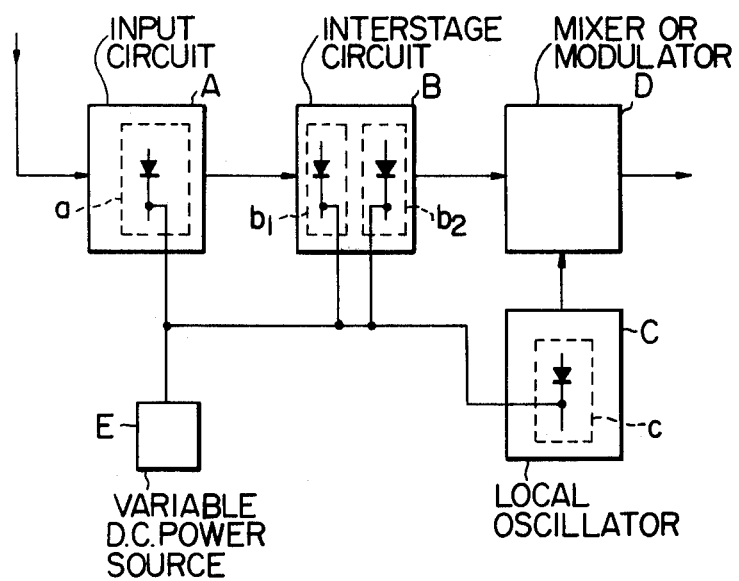
FIG. 1 is a schematic block diagram of a circuit arrangement of a conventional type of a tuner which may be tuned to the frequencies of a desired channel by varying a potential applied to a plurality of varactors provided therein.
Figure 2:
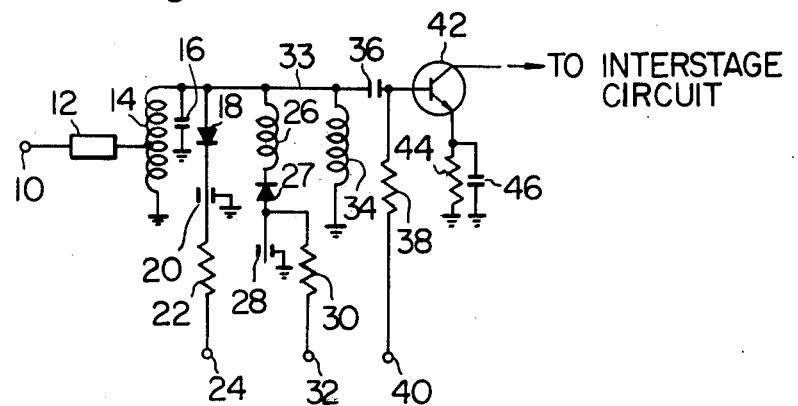
FIG. 2 shows a conventional input circuit of a VHF television set tuner.

Reference is now made to FIG. 2, wherein a typical example of a conventional input circuit of a television set tuner is schematically illustrated. Reference numeral 10 denotes an input or antenna terminal to which television signals are applied from a receiving antenna (not shown). A wave trap 12 is connected to the input terminal 10 for attenuating an intermediate frequency band involved within the incoming signals and/or rejecting undesired frequencies which interfere with tuned television signals. Adjacent the trap 12 there is provided an input transformer 14 a tap of which is connected to the wave trap 12, one terminal thereof to the ground, and the other terminal through a capacitor 36 to a transistor 42. The capacitor 36 is incorporated for impedance matching, whilst the transistor 42 is for amplification of tuned radio frequencies. A capacitor 16 is connected between a conducting line 33 and the ground for the purpose of impedance compensation in tracking. A varactor 18 is connected at its anode to the conducting line 33 and at its cathode to the terminal 24 through a capacitor 20 and a resistor 22. The resistor 22 supplies a suitable variable d.c. potential to the varactor 18 through the terminal 24 to which a variable d.c. power source (not shown) is coupled. An inductor 26 is interposed between the conducting line 33 and a cathode of a switching diode 27. The switching diode 27 behaves in such a manner that in the case of receiving one of higher channels it is rendered conductive to allow making a path for a high frequency signal, which path consists of the inductor 26, the switching diode 27, a capacitor 28, and the ground. On the other hand, in the case of receiving one of lower channels the diode 27 is rendered non-conductive. In the above, the changing of switching conditions is performed by a variable d.c. potential applied to the diode 27 through a resistor 30 from a terminal 32. An inductor 34 is connected between the conducting line 33 and the ground. The above-mentioned elements 14, 18, 26, 27, 34 form a main part of an input circuit where a desired television signal or channel is selected by varying both the capacitance of the varactor 18 and the switching condition of the diode 27. The transistor amplifier 42 is connected at its base through a resistor 38 to a terminal 40 in order that its gain can be automatically controlled, and is also connected at its emitter to a resistor 44 and a capacitor 46. The collector of the transistor 42 is connected to the interstage circuit B of FIG. 1 for transmitting the tuned television signal thereto.

It is understood that in the aforementioned conventional FIG. 2 circuit five elements, viz, the input transformer 14, the capacitors 16 and 36, and the inductors 26 and 34, are connected in parallel with respect to the varactor 18. Due to this circuit arrangement, there are encountered some defects in the prior art as set forth later.

In general, in the input circuit design of the VHF television set tuner, considerable attention must be paid to a number of factors, two of these factors requiring especial consideration: that is, the first is elevation of selectivity of incoming signals and the second is a widening of the range of tuned frequency variation due to change of d.c. potential applied to the varactor 18.

In order to elevate the selectivity, the following things are required: when selecting a higher channel, signal strength both within the frequency range of lower channels and above a selected channel is attenuated to a considerable extent, and on the other hand, when selecting a lower channel, signal strength within the frequency range of higher channels is reduced also to a considerable extent.

However, in accordance with the conventional FIG. 2 circuit, the circuit between the antenna terminal and the amplifier 42 (hereinafter referred to as a primary stage) is unable to sufficiently suppress the undesired signals above selected ones especially when the capacitance of the varactor 18 is less than 10pF. This is because the characteristics of the primary stage is very similar to those of a parallel resonance circuit. Furthermore, the FIG. 2 circuit is not suitable for attenuating signal strength lower than tuned signals in the case of lower channel selection.

Figure 3A:
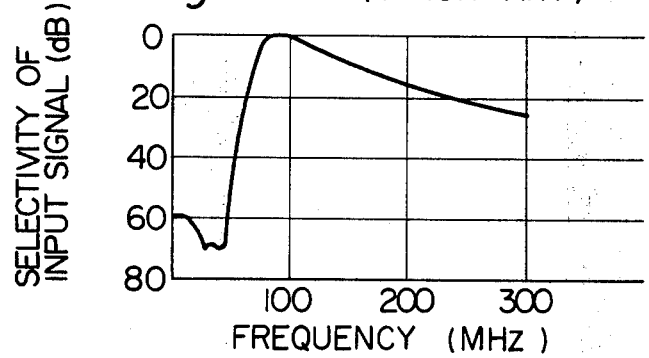
FIGS. 3a and 3b are graphs illustrating selectivities of input signals when receiving a lower and a higher channel, respectively, in accordance with the FIG. 2 circuit.

In FIG. 3a, there is shown a curve illustrating the selectivity of the incoming signals when one of lower channels is tuned by the conventional FIG. 2 circuit. As seen from the graph, attenuation of signal strength at about 200 MHz is only about 15 dB. The graph of FIG. 3a teaches that the FIG. 2 circuit can not sufficiently reject unwanted image frequencies of the selected one, etc.

Figure 3B:
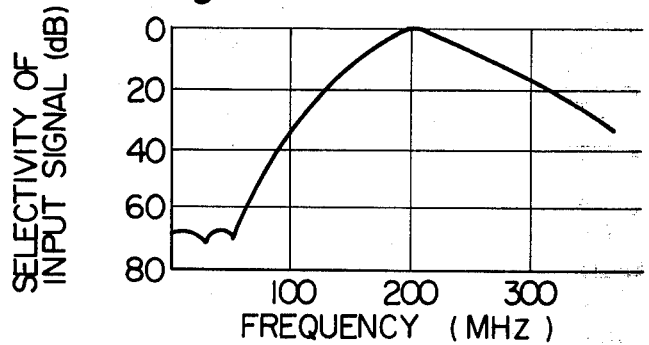

Turning to FIG. 3b, wherein there is a graph illustrating the selectivity of the incoming signals in the case where one of higher channels is tuned to by the conventional FIG. 2 circuit. In FIG. 3b, as is similar to FIG. 3a, signal strength above a tuned signal (200 MHz) is not sufficiently attenuated, resulting in undesirable effects such as interference with UHF (ultra high frequency) signals due to spurious signals. Furthermore, since a signal strength of a half of the tuned frequency (for example, tuned to 200 MHz) is not reduced to a considerable extent, resulting in the fact that the signal in the vicinity of 100 MHz causes its second harmonic wave thereby to invite a beat interference in the next RF (radio frequency) amplifying stage.

The second defect inherent to the FIG. 2 circuit is that the range of frequency variation due to change of the d.c. potential applied to the varactor 18 can not be widened to a sufficient extent. This is because the capacitor 36 is connected in parallel with the varactor 18 making narrower the frequency range in question. In other words, the existence of the capacitor 36 in the following equation decreases its result (viz, capacitance ratio) to narrow the frequency range as compared with a case in the absence of the capacitor 36.

$$n = (C_{max} + C_T + C_S + C_1)/(C_{min} + C_T + C_S + C_1)$$

where
$C_{min}$: minimum capacitance of the capacitor 18 when a maximum d.c. potential is applied thereto,
$C_{max}$: maximum capacitance of the capacitor 18 when a maximum d.c. potential is applied thereto,
$C_T$: capacitance of the capacitor 16,
$C_S$: total stray capacitance in parallel with the varactor 18, and
$C_1$: capacitance of the capacitor 36 and input capacitance of the transistor 42.

In the above equation, in order to raise the value of $n$ it is necessary to design the FIG. 2 circuit so as to minimize the effect of $C_1$.

Figure 4:
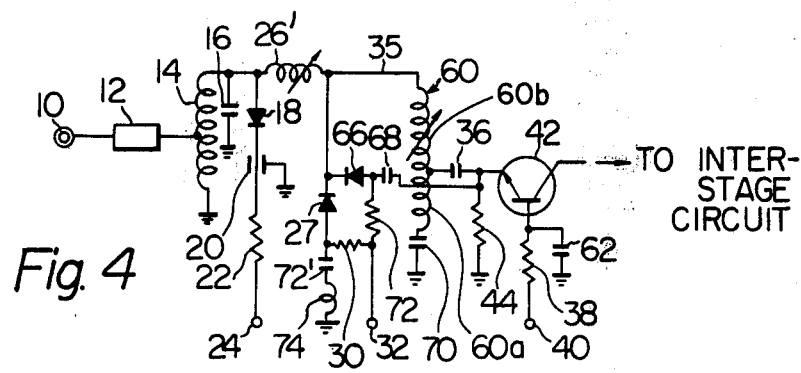
FIG. 4 shows an input circuit of a VHF television set tuner in accordance with the present invention.

Reference is now made to FIG. 4, wherein illustrated is a preferred input circuit of the present invention which is directed to obviate the above-mentioned defects inherent to the prior art. In the following, the same components as these of the FIG. 2 circuit will generally not be, referred to for the purpose of simplicity. One terminal of a first inductive element or inductor 26' is connected to the anode of the varactor 18 and the other terminal thereof to a transformer 60 for tuning of a lower channel and for impedance matching. A tap (no numeral) of the transformer 60 is connected through the capacitor 36 to the emitter of the transistor 42. A series resonance circuit, which consists of a capacitor 72 and a second inductive element 74, is connected via the switching diode 27 between a conducting line 35 and the ground. The series resonance circuit is employed for trapping undesirable signals when selecting one of higher channels, in the case of which the switching diode 27 is rendered conductive. The conducting state of the diode 27 is carried out by applying a suitable d.c. potential thereto through the resistor 30 from the terminal 32. A switching diode 66 is, upon reception of a higher channel, rendered conductive by a suitable d.c. potential applied through a resistor 72 from the terminal 32. Thus, tuned signals of a selected higher channel is transmitted through a d.c. blocking capacitor 68 to the emitter of the transistor 42. When selecting a lower channel, on the contrary, the switching diodes 27 and 66 are rendered non-conductive in order to establish a resonance circuit made up of the varactor 18, the first inductor 26' (although its inductance is very low in lower channel selection), and the transformers 14, 60. In this manner, tuned signals of the selected lower channel are applied through the tap of the transformer 60 and the capacitor 36 to the emitter of the transistor 42. The transistor 42 is connected at its base through the resistor 38 to the terminal 40 in order that its gain is automatically controlled as previously mentioned, and is also connected through a capacitor 62 to the ground. The capacitor 62 is provided for making a by-pass for high frequency signals.

As shown in FIG. 4, the capacitor 36 is not directly connected to the varactor 18. In the circuit of the present invention, therefore, when receiving a higher channel, impedance matching between the transistor 42 and its preceding circuit is carried out not by the capacitor 36 but by the inductors 26' and 74. The inductance of the inductor 26' is adjusted and set during manufacturing in order to set a proper inductance ratio with respect to that of the inductor 74, whereby desired impedance matching between the transistor 42 and its preceding circuit is achieved during reception of a higher channel. Whilst, when receiving a lower channel, the above-mentioned impedance matching is not performed by the capacitor 36 but by adjusting a winding ratio of the transformer 60. The inductance of the upper part 60b of the transformer 60 is adjusted and set during manufacturing in order to set a proper inductance ratio with respect to that of a lower part 60a of the transformer 60, whereby desired impedance matching between the transistor 42 and its preceding circuit is achieved during reception of a lower channel. In the above, upon reception of a higher channel, adequate impedance matching can be carried out by means of the inductors 26' and 74 so that the capacitor 68 acts as a d.c. blocking element. However, the capacitance of the capacitor 68 is selected such that the capacitor 68, when receiving a higher channel, is sufficient for preventing low frequency signals passing through the switching diode 66.

Figure 5A:
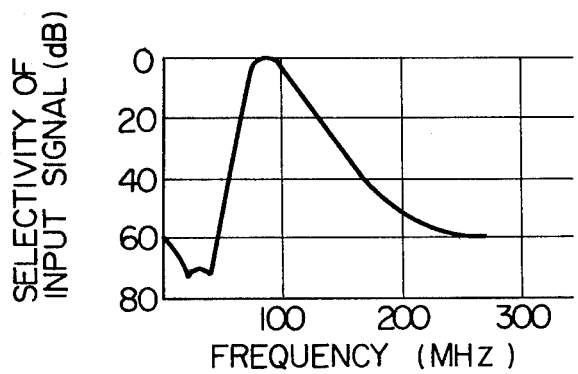
FIGS. 5a and 5b are graphs illustrating selectivities of input signals when receiving a lower and a higher channel, respectively, in accordance with the present invention.
Figure 5B:
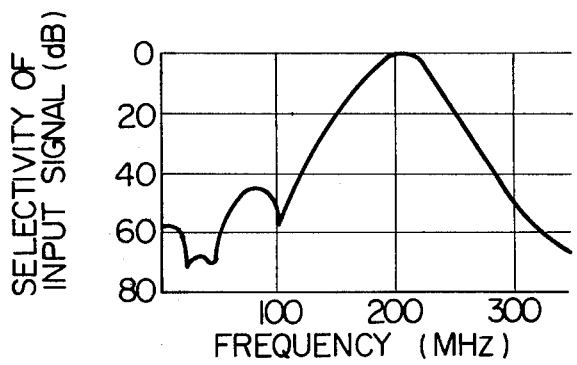

From the foregoing, it is understood that the circuit between the antenna terminal 10 and the transistor 42 of FIG. 4 acts as a kind of a low-pass filter, so that signal strength above selected frequencies can be comparatively attenuated. This means the FIG. 4 circuit has a high selectivity of the incoming signals in comparison with the FIG. 2 circuit. Response curves illustrating the above character are shown in FIGS. 5a (in the case of receiving a lower channel) and 5b (in the case of receiving a higher channel).

Another advantage of the present invention resides in a provision of the series resonance circuit (a wave trap) which is made up of the capacitor 72' and the inductor 74. The applicant conducted an experiment which teaches that, when adjusting the resonance frequency of the wave trap to 100 MHz for example, a signal with a half of the frequency (100 MHz) of a tuned signal (200 MHz) is attenuated up to above 50 dB. This means that the signal with the half of the frequency of the desired signal, which is very detrimental prevents reproduction of a clear picture and sound, can be sufficiently reduced. Moreover, the capacitor 70 and the inductor 60a, which is a lower part of the inductor 60, serve as a wave trap in lower channel selection, wherein the resonance frequency of the wave trap is set to an i-f frequency, for example.

Figure 6:
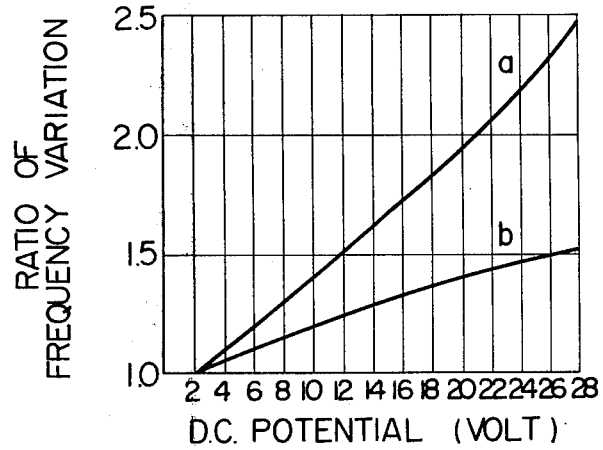
FIG. 6 is a graph illustrating a ratio of tuned frequency variation of an input circuit of the FIG. 5 circuit together with that of the FIG. 2 circuit.

Furthermore, from the foregoing, it is also understood that the capacitor 36 is not directly connected in parallel to the varactor 18 so that the result of the above-mentioned equation is no longer affected by the capacitance of the capacitor 36 (that is, the capacitance $C_1$ in the equation is now negligible), thereby to increase the value of $n$. This means the input circuit of the present invention is able to remarkably improve the tuned frequency variation as a function of a d.c. potential applied to the varactor 18 as compared with that of the FIG. 2 circuit. FIG. 6 is a graph showing an example of the ratio of the tuned frequency variation according to the FIG. 4 circuit together with that of the FIG. 2 circuit, wherein the former is denoted by reference character a and the latter by reference character b.

From the foregoing, in accordance with the present invention, spurious signals, such as those with image frequency and a half of the frequency of a tuned signal, can be removed to a sufficient extent. Furthermore, in accordance with the present invention, a wide range of variation of tuned frequency is obtainable which has been very difficult to get in the conventional input circuit. These advantages of the present invention allow a wide range of choice with respect to varactors and also allow the input circuit of the present invention to be applicable to various television frequencies in different countries with slight or no circuit modification.

What is claimed is:

1. In an input circuit for use in a television set tuner tunable to the frequencies of a desired channel by varying a d.c. potential applied to a plurality of varactors provided therein, the input circuit being interposed between a receiving antenna and an interstage circuit of the tuner and including a first stage and a second stage, the first stage being connected to the receiving antenna for selecting the desired channel and the second stage including a r-f amplifier for amplifying signals of the desired channel, wherein said first stage comprises:

a varactor;
first and second inductive elements which are connected in series with each other and in parallel with the varactor and forming a resonance circuit therewith for selecting a desired lower channel, the second inductive element having at least one tap connected to the second stage for transmitting signals of the desired lower channel;
a third inductive element connected to a junction of the first and the second inductive elements and connected in series with the first inductive element and forming therewith a parallel resonance circuit with the varactor for selecting a desired higher channel;
first switching means interposed between the junction and the second stage and being operable to conduct for transmitting the desired higher channel therethrough to the second stage;
a capacitor connected in series with the third inductive element and forming a wave trap therewith; and
a second switching means interposed between the junction and the wave trap and being rendered conductive when receiving the desired higher channel for passing the same, and the first and the second switching means being rendered non-conductive when receiving the desired lower channel.

2. An input circuit claimed in claim 1, wherein impedance matching between the first stage and the second stage is carried out by adjusting the winding ratio of the second inductive element in the case of selection of the desired lower channel and, whilst, by adjusting the ratio of the inductance of the first and the third inductive elements in the case of selection of the desired higher channel.

* * * * *